(12) United States Patent
Chen et al.

(10) Patent No.: US 11,916,376 B2
(45) Date of Patent: Feb. 27, 2024

(54) OVERDRIVE ELECTROSTATIC DISCHARGE CLAMP

(71) Applicant: MEDIATEK INC., Hsinchu (TW)

(72) Inventors: Jie-Ting Chen, Hsinchu (TW); Wei-Lun Sun, Hsinchu (TW)

(73) Assignee: MEDIATEK INC., Hsinchu (TW)

(\*) Notice: Subject to any disclaimer, the term of this patent is extended or adjusted under 35 U.S.C. 154(b) by 0 days.

(21) Appl. No.: 17/580,926

(22) Filed: Jan. 21, 2022

(65) Prior Publication Data

US 2022/0352711 A1 Nov. 3, 2022

Related U.S. Application Data

(60) Provisional application No. 63/181,397, filed on Apr. 29, 2021.

(51) Int. Cl.
*H02H 9/04* (2006.01)
*H01L 27/02* (2006.01)

(52) U.S. Cl.
CPC ......... *H02H 9/046* (2013.01); *H01L 27/0285* (2013.01)

(58) Field of Classification Search
CPC ............. H02H 9/046; H01L 27/0285; H03K 19/00315
USPC .......................................................... 361/56
See application file for complete search history.

(56) References Cited

U.S. PATENT DOCUMENTS

| | | |
|---|---|---|
| 9,893,517 B2 | 2/2018 | Dey et al. |
| 11,146,060 B2 | 10/2021 | Hsu et al. |
| 2004/0027742 A1\* | 2/2004 | Miller ................. H01L 27/0292 361/111 |
| 2014/0029144 A1\* | 1/2014 | Kaku ..................... H02H 9/046 361/56 |
| 2015/0288173 A1 | 10/2015 | Chen et al. |
| 2016/0172350 A1 | 6/2016 | Dey et al. |
| 2018/0351352 A1\* | 12/2018 | Chen .................. H01L 27/0922 |
| 2019/0341772 A1\* | 11/2019 | Hsu ...................... G01R 31/002 |

(Continued)

FOREIGN PATENT DOCUMENTS

| | | |
|---|---|---|
| TW | I670911 B | 9/2019 |
| TW | I677961 B | 11/2019 |

OTHER PUBLICATIONS

Extended European Search Report dated Sep. 6, 2022, issued in application No. EP 22160627.0.

(Continued)

*Primary Examiner* — Dharti H Patel

(74) *Attorney, Agent, or Firm* — McClure, Qualey & Rodack, LLP

(57) ABSTRACT

An electrostatic discharge clamp is shown, which includes a clamping circuit, a driving circuit, a capacitor and resistor network, and a bias circuit. The clamping circuit has a plurality of transistors connected in a cascode configuration. The driving circuit is coupled to the gates of the transistors of the clamping circuit. The capacitor and resistor network introduces an RC delay in response to an electrostatic discharge event to control the driving circuit to turn on the transistors of the clamping circuit for electrostatic discharging. The bias circuit biases the driving circuit to turn off the transistors of the clamping circuit when the capacitor and resistor network does not detect the electrostatic discharge event.

14 Claims, 8 Drawing Sheets

(56) References Cited

U.S. PATENT DOCUMENTS

2020/0083705 A1    3/2020  Xavier
2023/0138437 A1*   5/2023  Wu .................... H01L 27/0285
                                                           361/56

OTHER PUBLICATIONS

Chinese language office action dated Dec. 15, 2022, issued in application No. TW 111111640.

* cited by examiner

OVERDRIVE ELECTROSTATIC DISCHARGE CLAMP

CROSS REFERENCE TO RELATED APPLICATIONS

This application claims the benefit of U.S. Provisional Application No. 63/181,397, filed Apr. 29, 2021, the entirety of which is incorporated by reference herein.

BACKGROUND OF THE INVENTION

Field of the Invention

The present invention relates to an electrostatic discharge clamp in an overdriving system.

Description of the Related Art

As the technology used in the semiconductor manufacturing process evolves (e.g., scaling down to 5 nm, 4 nm, 3 nm, or below), the maximum applied voltage is suppressed (e.g., down to 1.2 V, much lower than the 1.8V applied to the 7 nm products). If there are 7 nm chips as well as more advanced (5 nm/4 nm/3 nm or below) chips on the same printed circuit board (PCB), the power system should provide an overdriving design (e.g., VDD=2.5 V or 3.3 V), which may result in reliability problems in advanced transistors.

An electrostatic discharge clamp is a necessary device in a chip. An electrostatic discharge clamp having high reliability in an overdriving system is called for.

BRIEF SUMMARY OF THE INVENTION

An electrostatic discharge clamp in accordance with an exemplary embodiment of the present invention includes a clamping circuit, a driving circuit, a capacitor and resistor network, and a bias circuit. The clamping circuit includes a plurality of transistors connected in a cascode configuration. The driving circuit is coupled to the gates of the transistors of the clamping circuit. The capacitor and resistor network introduces an RC delay in response to an electrostatic discharge event to control the driving circuit to turn on the transistors of the clamping circuit for electrostatic discharging. The bias circuit biases the driving circuit to turn off the transistors of the clamping circuit when the capacitor and resistor network does not detect the electrostatic discharge event.

In an exemplary embodiment, the capacitor and resistor network comprises a resistor and a plurality of capacitors. The capacitors are connected in series. A resistor-to-capacitor connection terminal between the resistor and the capacitors is coupled to a first control terminal of the driving circuit. In response to the electrostatic discharge event, a voltage change at the resistor-to-capacitor connection terminal is coupled to the first control terminal of the driving circuit.

In an exemplary embodiment, the number of transistors is N. the number of capacitors in the capacitor and resistor network is N. The first capacitor-to-capacitor connection terminal to the $(N-1)_{th}$ capacitor-to-capacitor connection terminal connecting the N capacitors in the capacitor and resistor network in series are coupled to a second control terminal to an $N_{th}$ control terminal of the driving circuit, respectively. The driving circuit has N output terminals coupled one-to-one to the gates of the N transistors of the clamping circuit.

In an exemplary embodiment, the driving circuit comprises N inverters. The first control terminal to the $N_{th}$ control terminal of the driving circuit are coupled to input terminals of the N inverters one to one. Output terminals of the N inverters are coupled to the N output terminals of the driving circuit one to one.

In an exemplary embodiment, the bias circuit comprises N bias units connected in series. The first connection terminal to the $(N-1)_{th}$ connection terminal connecting the N bias units in series are coupled to the first capacitor-to-capacitor connection terminal to the $(N-1)_{th}$ capacitor-to-capacitor connection terminal, respectively.

In an exemplary embodiment, the N transistors are p-channel metal oxide semiconductor field-effect transistors connected between a power line and the system ground. The resistor in the capacitor and resistor network is connected between the resistor-to-capacitor connection terminal and the system ground. The N inverters each have a first bias terminal and a second bias terminal. The first control terminal of the driving circuit is coupled to an input terminal of a first inverter of the N inverters. A second bias terminal of the first inverter is coupled to the system ground. A first bias terminal of an $N_{th}$ inverter of the N inverters is coupled to the power line. Second bias terminals of the second to the $N_{th}$ inverter of the N inverters are coupled to output terminals of the first to the $(N-1)_{th}$ inverters of the N inverters, respectively. The first connection terminal to the $(N-1)_{th}$ connection terminal connecting the bias units in series from the system ground to the power line are further coupled to first bias terminals of the first to the $(N-1)_{th}$ inverters, respectively.

In an exemplary embodiment, the N transistors are n-channel metal oxide semiconductor field-effect transistors connected between a power line and the system ground. The resistor in the capacitor and resistor network is connected between the power line and the resistor-to-capacitor connection terminal. The N inverters each have a first bias terminal and a second bias terminal. The first control terminal of the driving circuit is coupled to an input terminal of a first inverter of the N inverters. A first bias terminal of the first inverter is coupled to the power line. A second bias terminal of an $N_{th}$ inverter of the N inverters is coupled to the system ground. First bias terminals of the second to the $N_{th}$ inverter of the N inverters are coupled to output terminals of the first to the $(N-1)_{th}$ inverters of the N inverters, respectively. The first connection terminal to the $(N-1)_{th}$ connection terminal connecting the bias units in series from the power line to the system ground are further coupled to second bias terminals of the first to the $(N-1)_{th}$ inverters, respectively.

In an exemplary embodiment, there are more than 2 clamping transistors. The electrostatic discharge clamp is operated in an overdriving system.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
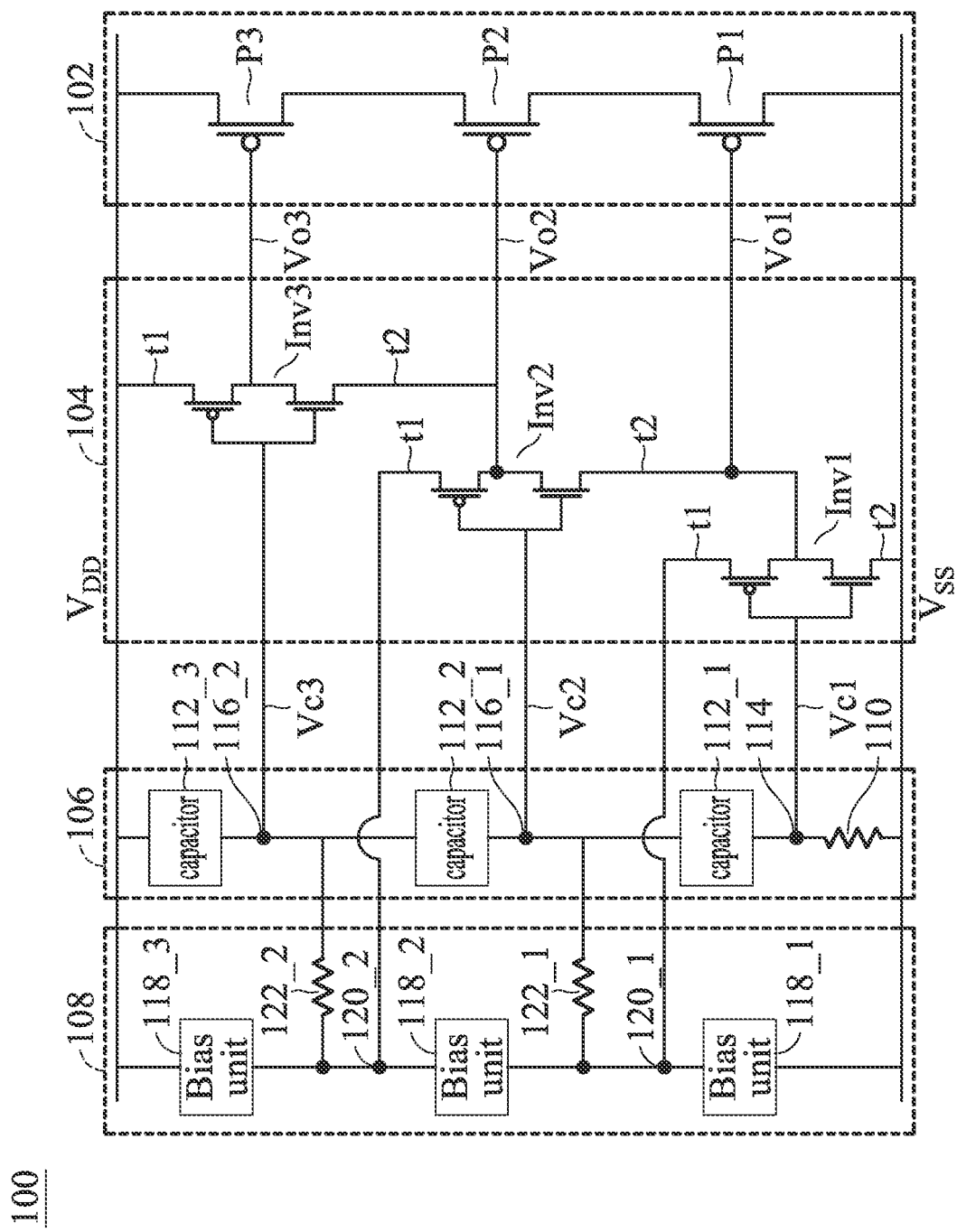
FIG. 1 illustrates an electrostatic discharge clamp 100 in accordance with an exemplary embodiment of the present invention.

FIG. 1 illustrates an electrostatic discharge clamp 100 in accordance with an exemplary embodiment of the present invention, which includes a clamping circuit 102, a driving circuit 104, a capacitor and resistor network 106, and a bias circuit 108.

The clamping circuit 102 includes a plurality of p-channel metal oxide semiconductor field-effect transistors (PMOSs) P1, P2 and P3 connected in a cascode configuration to deal with the overdriving design (e.g., VDD 2.5 V or 3 V while the chip is manufactured by an advanced process such as 5 nm/4 nm/3 nm or below). In this example, the number of PMOSs is 3 but not intended to be limited thereto. The number of transistors in the coscode configuration between the power line VDD and the system ground VSS depends on the overdriving level (VDD) and the manufacture process of the chip.

The driving circuit 104 is coupled to the gates of the PMOSs P1, P2 and P3 of the clamping circuit 102. The capacitor and resistor network 106 introduces an RC delay in response to an electrostatic discharge event (e.g., an ESD stress on the power line VDD) to control the driving circuit 104 to turn on the PMOSs P1, P2 and P3 for electrostatic discharging. The bias circuit 108 biases the driving circuit 104 to turn off the PMOSs P1, P2 and P3 when the capacitor and resistor network 106 does not detect any electrostatic discharge event. The leakage current is efficiently suppressed because of the normally turned-off PMOSs.

As shown, the capacitor and resistor network 106 comprises a resistor 110 and a plurality of capacitors 112_1, 112_2, and 112_3. The capacitors 112_1, 112_2, and 112_3 are connected in series. A resistor-to-capacitor connection terminal 114 between the resistor 110 and the capacitors 112_1, 112_2, and 112_3 is coupled to a first control terminal Vc1 of the driving circuit 104. The resistor 110 in the capacitor and resistor network 106 is connected between the resistor-to-capacitor connection terminal 114 and the system ground Vss. In response to an electrostatic discharge event, a voltage change at the resistor-to-capacitor connection terminal 114 is coupled to the first control terminal Vc1 of the driving circuit 104. Note that the resistor number used in the capacitor and resistor network 106 is just one. The single resistor 110 guarantees that the turn-on voltage to build an electrostatic discharging path through the PMOSs P1, P2 and P3 is very low. The electrostatic discharge clamp 100 is reliable.

The number of capacitors 112_1, 112_2, and 112_3 in the capacitor and resistor network 106 is the same as the number of PMOSs P1, P2 and P3 in the clamping circuit 102, which is 3 (N is 3) in this case. The first capacitor-to-capacitor connection terminal 116_1 and the second capacitor-to-capacitor connection terminal 116_2 connecting the three capacitors 112_1, 112_2, and 112_3 in the capacitor and resistor network 106 in series are coupled to the second control terminal Vc2 and the third control terminal Vc3 of the driving circuit 104, respectively. The driving circuit 104 has output terminals Vo1, Vo2, and Vo3 coupled to the gates of the PMOSs P1, P2 and P3 of the clamping circuit 102 one to one. The driving circuit comprises three inverters Inv1, Inv2, and Inv3. The control terminals Vc1, Vc2, and Vc3 of the driving circuit 104 are coupled to input terminals of the three inverters Inv1, Inv2, and Inv3 one to one. The output terminals of the three inverters Inv1, Inv2, and Inv3 are coupled to the three output terminals Vo1, Vo2, and Vo3 of the driving circuit 104 one to one. Each inverter corresponds to the control of one clamping transistor.

The bias circuit 108 comprises three bias units 118_1, 118_2, and 118_3 connected in series. The first connection terminal 120_1 and the second connection terminal 120_2 connecting the three bias units in series are coupled to the first capacitor-to-capacitor connection terminal 116_1 and the second capacitor-to-capacitor connection terminal 116_2, respectively.

The bias circuit 108 further comprises two resistors 122_1 and 122_2. The first connection terminal 120_1 and the second connection terminal 120_2 are coupled to the first capacitor-to-capacitor connection terminal 116_1 and the second capacitor-to-capacitor connection terminal 116_2, respectively, through the two resistors 122_1 and 122_2. The resistors 122_1 and 122_2 are optional.

The three inverters Inv1, Inv2, and Inv3 each have a first bias terminal t1 and a second bias terminal t2. The first control terminal Vc1 of the driving circuit 104 is coupled to an input terminal of a first inverter Inv1. The second bias terminal t2 of the first inverter Inv1 is coupled to the system ground Vss. The first bias terminal t1 of the third inverter Inv3 is coupled to the power line VDD. The second bias terminals t2 of the second and the third inverters Inv2 and Inv3 are coupled to the output terminals of the first and the second inverters Inv1 and Inv2, respectively. The first connection terminal 120_1 and the second connection terminal 120_2 connecting the bias units 118_1, 118_2, and 118_3 in series from the system ground VSS to the power line VDD are further coupled to the first bias terminal t1 of the first inverter Inv1 and the first bias terminal t1 of the second inverter Inv2, respectively.

The inverters Inv1 to Inv3 in the driving circuit 104 are stacked one by one. No diode string is required to bias the inverters Inv_1, Inv2, and Inv3. In a conventional electrostatic discharge clamp, a parasitic leakage path is introduced by a diode string used in the driving circuit. Such a parasitic leakage path does not exist in the driving circuit 104 of the present invention.

Figure 2:
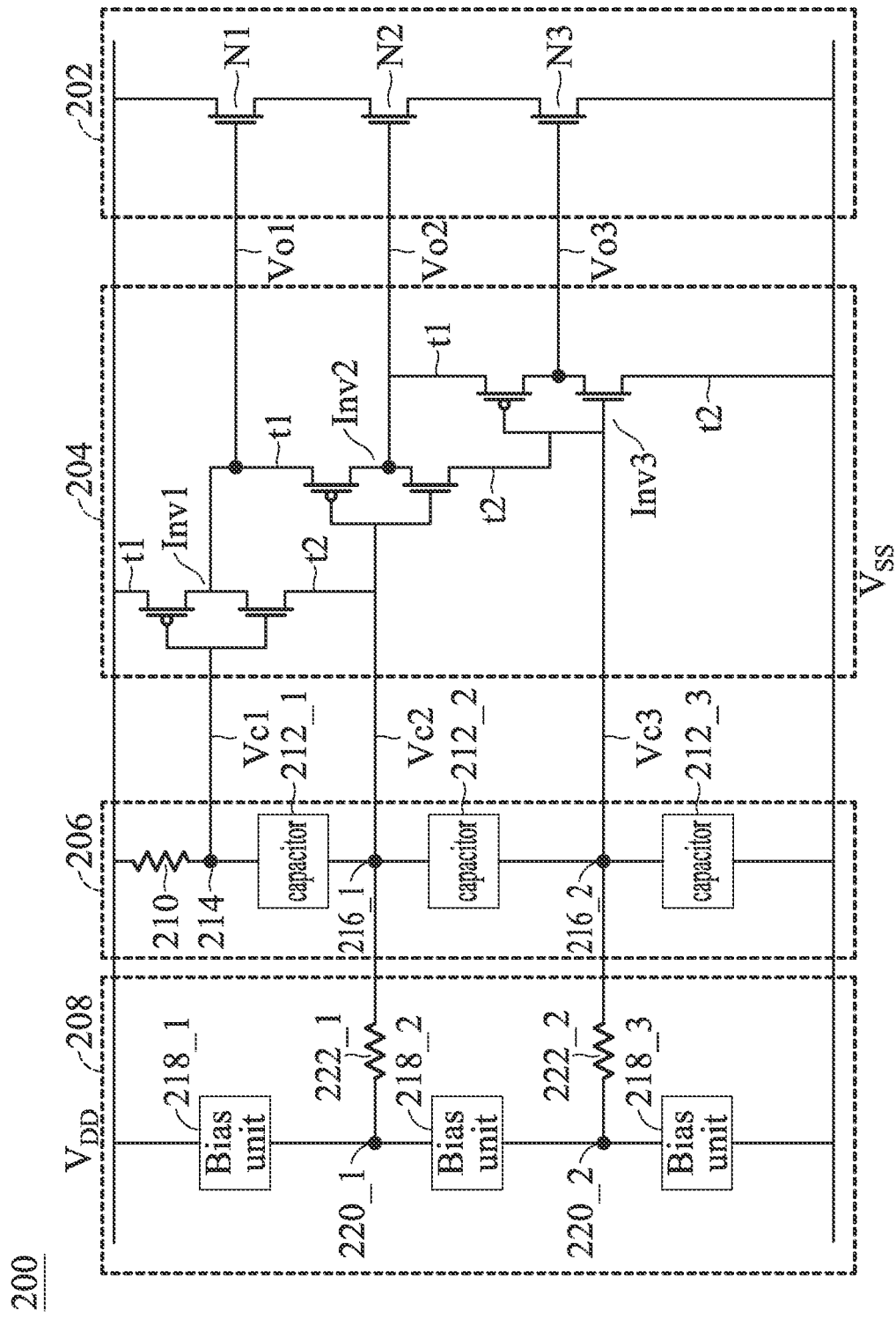
FIG. 2 illustrates another electrostatic discharge clamp 200 in accordance with an exemplary embodiment of the present invention.

FIG. 2 illustrates another electrostatic discharge clamp 200 in accordance with an exemplary embodiment of the present invention, which includes a clamping circuit 202, a driving circuit 204, a capacitor and resistor network 206, and a bias circuit 208. The clamping circuit 202 uses a plurality of n-channel metal oxide semiconductor field-effect transistors (NMOSs) N1, N2 and N3 to replace the PMOSs P1, P2, and P3 of FIG. 1.

The driving circuit 204 is coupled to gates of the NMOSs N1, N2 and N3 of the clamping circuit 202. The capacitor and resistor network 206 introduces an RC delay in response to an electrostatic discharge event (e.g., an ESD stress on the power line VDD) to control the driving circuit 204 to turn on the NMOSs N1, N2 and N3 for electrostatic discharging. The bias circuit 208 biases the driving circuit 204 to turn off the NMOSs N1, N2 and N3 when the capacitor and resistor network 206 does not detect any electrostatic discharge event. In such a structure, the NMOSs N1, N2 and N3 in the clamping circuit 202 are normally turned off when no electrostatic discharge event occurs. The leakage current is efficiently suppressed.

As shown, the capacitor and resistor network 206 comprises a resistor 210 and a plurality of capacitors 212_1, 212_2, and 212_3. The capacitors 212_1, 212_2, and 212_3 are connected in series. A resistor-to-capacitor connection terminal 214 between the resistor 210 and the capacitors 212_1, 212_2, and 212_3 is coupled to a first control terminal Vc1 of the driving circuit 204. The resistor 210 in the capacitor and resistor network 206 is connected between the resistor-to-capacitor connection terminal 214 and the power line VDD. In response to an electrostatic discharge event, a voltage change at the resistor-to-capacitor connection terminal 214 is coupled to the first control terminal Vc1 of the driving circuit 204. Note that the resistor number used in the capacitor and resistor network 206 is just one. The single resistor 210 guarantees that the turn-on voltage to build an electrostatic discharging path through the NMOSs N1, N2 and N3 is very low. The electrostatic discharge clamp 200 is reliable.

The number of capacitors 212_1, 212_2, and 212_3 in the capacitor and resistor network 206 is the same as the number of NMOSs N1, N2 and N3 in the clamping circuit 202, which is 3 (N is 3) in this case. The first capacitor-to-capacitor connection terminal 216_1 and the second capacitor-to-capacitor connection terminal 216_2 connecting the three capacitors 212_1, 212_2, and 212_3 in the capacitor and resistor network 206 in series are coupled to the second control terminal Vc2 and the third control terminal Vc3 of the driving circuit 204, respectively. The driving circuit 204 has output terminals Vo1, Vo2, and Vo3 coupled to the gates of the NMOSs N1, N2 and N3 of the clamping circuit 202 one to one. The driving circuit 204 comprises three inverters Inv1, Inv2, and Inv3. The first, second, and third control terminals Vc1, Vc2, and Vc3 of the driving circuit 204 are coupled to input terminals of the three inverters Inv1, Inv2, and Inv3 one to one. The output terminals of the three inverters Inv1, Inv2, and Inv3 are coupled to the three output terminals Vo1, Vo2, and Vo3 of the driving circuit 204 one to one. Each inverter corresponds to the control of one clamping transistor.

The bias circuit 208 comprises three bias units 218_1, 218_2, and 218_3 connected in series. The first connection terminal 220_1 and the second connection terminal 220_2 connecting the three bias units 218_1, 218_2, and 218_3 in series are coupled to the first capacitor-to-capacitor connection terminal 216_1 and the second capacitor-to-capacitor connection terminal 216_2, respectively.

The bias circuit 208 further comprises two resistors 222_1 and 222_2. The first connection terminal 220_1 and the second connection terminal 220_2 are coupled to the first capacitor-to-capacitor connection terminal 216_1 and the second capacitor-to-capacitor connection terminal 216_2, respectively, through the two resistors 222_1 and 222_2.

The three inverters Inv1, Inv2, and Inv3 each have a first bias terminal t1 and a second bias terminal t2. The first control terminal Vc1 of the driving circuit 204 is coupled to an input terminal of a first inverter Inv1. The first bias terminal t1 of the first inverter Inv1 is coupled to the power line VDD. The second bias terminal t2 of the third inverter Inv3 is coupled to the system ground VSS. The first bias terminals t1 of the second and the third inverter Inv2 and Inv3 are coupled to output terminals of the first and second inverters Inv1 and Inv2, respectively. The first connection terminal 220_1 and the second connection terminal 220_2 connecting the bias units 218_1, 218_2, and 218_3 in series from the power line VDD to the system ground VSS are further coupled to the second bias terminal t2 of the first inverter Inv1 and the second bias terminal t2 of the second inverter Inv2, respectively.

The electrostatic discharge clamp 200 using NMOSs as the clamping transistors also works well.

Figure 3C:
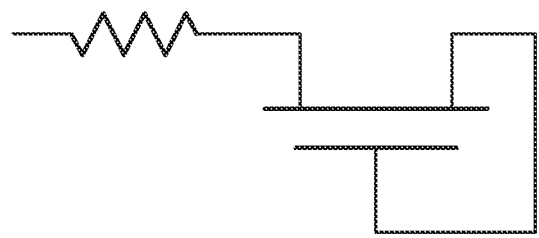
FIGS. 3A to 3E illustrate examples of the bias units in the bias circuit 108/208.
Figure 3B:
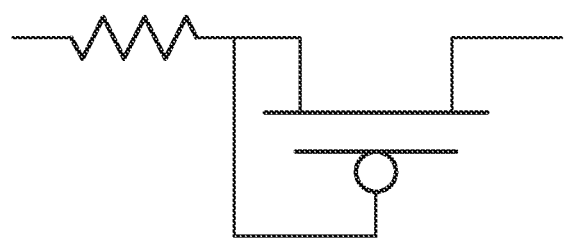
Figure 3A:
Figure 3E:
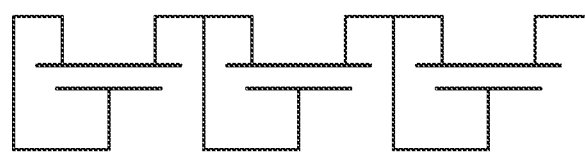
Figure 3D:
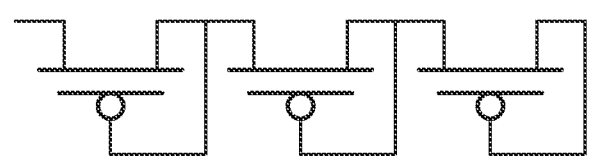

FIGS. 3A to 3E illustrate examples of the bias units in the bias circuit 108/208. Each bias unit may be a resistor (FIG. 3A). In another exemplary embodiment, each bias unit may comprise a resistor and an off-state PMOS connected in series (FIG. 3B), or a resistor and an off-state NMOS connected in series (FIG. 3C). In another exemplary embodiment, the bias units form a diode string (referring to the PMOS diode string in FIG. 3D, or the NMOS diode string in FIG. 3E).

Figure 4C:
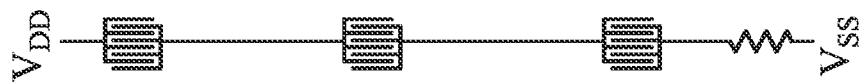
FIGS. 4A to 4E illustrate examples of the capacitor and resistor network 106.
Figure 4B:
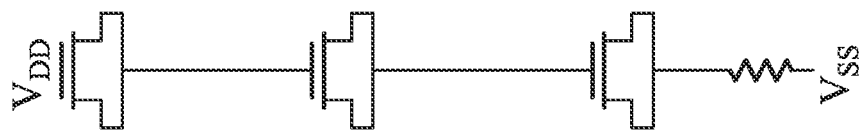
Figure 4A:
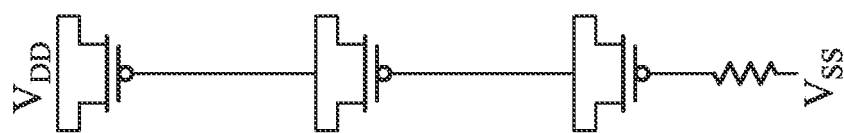
Figure 4E:
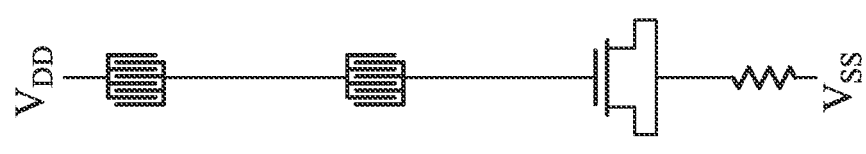
Figure 4D:
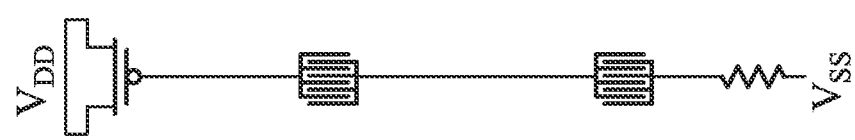

FIGS. 4A to 4E illustrate examples of the capacitor and resistor network 106. In FIG. 4A, each capacitor in the capacitor and resistor network 106 is a PMOS capacitor. In FIG. 4B, each capacitor in the capacitor and resistor network 106 is an NMOS capacitor. In FIG. 4C, the capacitors in the capacitor and resistor network 106 are all metal-oxide-metal (MOM) capacitors, or are all metal-insulator-metal (MIM) capacitors. In FIGS. 4D and 4E, the capacitors in the capacitor and resistor network 106 are in a hybrid configuration formed by metal-oxide-semiconductor and metal-oxide-metal capacitors, or, formed by metal-oxide-semiconductor and metal-insulator-metal capacitors.

Figure 5C:
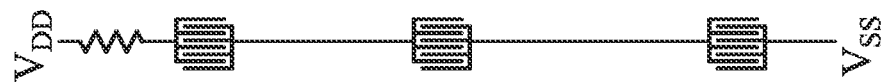
FIGS. 5A to 5E illustrate examples of the capacitor and resistor network 206.
Figure 5B:
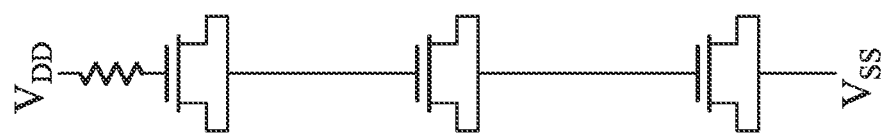
Figure 5A:
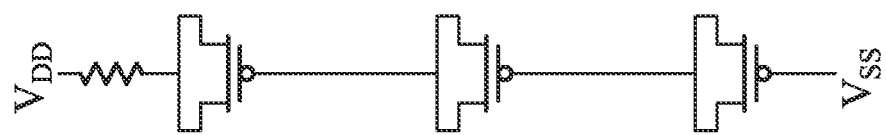
Figure 5E:
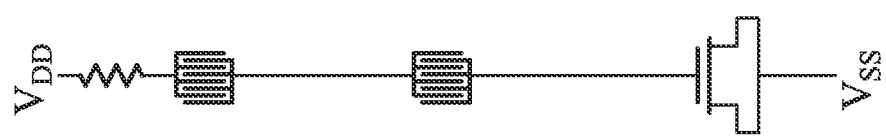
Figure 5D:
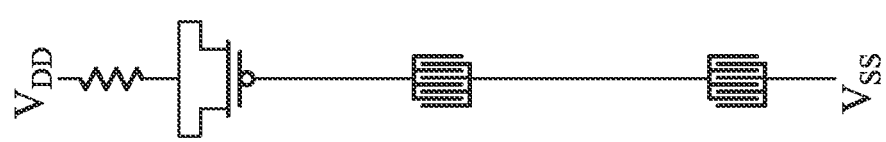

FIGS. 5A to 5E illustrate examples of the capacitor and resistor network 206. In FIG. 5A, each capacitor in the capacitor and resistor network 206 is a PMOS capacitor. In FIG. 5B, each capacitor in the capacitor and resistor network 206 is an NMOS capacitor. In FIG. 5C, the capacitors in the capacitor and resistor network 206 are all metal-oxide-metal (MOM) capacitors, or are all metal-insulator-metal (MIM) capacitors. In FIGS. 5D and 5E, the capacitors in the capacitor and resistor network 206 are in a hybrid configuration formed by metal-oxide-semiconductor and metal-oxide-metal capacitors, or, formed by metal-oxide-semiconductor and metal-insulator-metal capacitors.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge clamp, comprising:
a clamping circuit, comprising a plurality of transistors connected in a cascode configuration between a power line and a system ground, wherein the number of the plurality of transistors depending on an overdriving level on the power line and manufacturing process is greater than two, the overdriving level is 2.5V or 3.3V, and the manufacture process is 5 nm, or 4 nm, or 3 nm or below;
a driving circuit, coupled to gates of the transistors of the clamping circuit;

a capacitor and resistor network, introducing an RC delay in response to an electrostatic discharge event to control the driving circuit to turn on the transistors of the clamping circuit for electrostatic discharging; and a bias circuit, biasing the driving circuit to turn off the transistors of the clamping circuit when the capacitor and resistor network does not detect the electrostatic discharge event.

2. The electrostatic discharge clamp as claimed in claim 1, wherein:

the capacitor and resistor network comprises a resistor and a plurality of capacitors;

the capacitors are connected in series;

a resistor-to-capacitor connection terminal between the resistor and the capacitors is coupled to a first control terminal of the driving circuit; and in response to the electrostatic discharge event, a voltage change at the resistor-to-capacitor connection terminal is coupled to the first control terminal of the driving circuit.

3. The electrostatic discharge clamp as claimed in claim 2, wherein:

the number of transistors is N;

the number of capacitors in the capacitor and resistor network is N;

a first capacitor-to-capacitor connection terminal to an $(N-1)_{th}$ capacitor-to-capacitor connection terminal connecting the N capacitors in the capacitor and resistor network in series are coupled one-to-one to a second control terminal to an $N_{th}$ control terminal of the driving circuit; and the driving circuit has N output terminals coupled one-to-one to the gates of the N transistors of the clamping circuit.

4. The electrostatic discharge clamp as claimed in claim 3, wherein:

the driving circuit comprises N inverters;

the first control terminal to the $N_{th}$ control terminal of the driving circuit are coupled to input terminals of the N inverters one to one;

output terminals of the N inverters are coupled to the N output terminals of the driving circuit one to one.

5. The electrostatic discharge clamp as claimed in claim 4, wherein:

the bias circuit comprises N bias units connected in series;

a first connection terminal to an $(N-1)_{th}$ connection terminal connecting the N bias units in series are coupled to the first capacitor-to-capacitor connection terminal to the $(N-1)_{th}$ capacitor-to-capacitor connection terminal, respectively.

6. The electrostatic discharge clamp as claimed in claim 5, wherein:

the bias circuit further comprises (N-1) resistors; and the first connection terminal to the $(N-1)_{th}$ connection terminal are coupled to the first capacitor-to-capacitor connection terminal to the $(N-1)_{th}$ capacitor-to-capacitor connection terminal, respectively, through the (N-1) resistors.

7. The electrostatic discharge clamp as claimed in claim 5, wherein:

the N transistors are p-channel metal oxide semiconductor field-effect transistors connected between the power line and the system ground;

the resistor in the capacitor and resistor network is connected between the resistor-to-capacitor connection terminal and the system ground;

the N inverters each have a first bias terminal and a second bias terminal;

the first control terminal of the driving circuit is coupled to an input terminal of a first inverter of the N inverters;

a second bias terminal of the first inverter is coupled to the system ground;

a first bias terminal of an $N_{th}$ inverter of the N inverters is coupled to the power line;

second bias terminals of a second to the $N_{th}$ inverter of the N inverters are coupled to output terminals of the first to an $(N-1)_{th}$ inverters of the N inverters, respectively; and the first connection terminal to the $(N-1)_{th}$ connection terminal connecting the bias units in series from the system ground to the power line are further coupled to first bias terminals of the first to the $(N-1)_{th}$ inverters, respectively.

8. The electrostatic discharge clamp as claimed in claim 5, wherein:

the N transistors are n-channel metal oxide semiconductor field-effect transistors connected between the power line and the system ground;

the resistor in the capacitor and resistor network is connected between the power line and the resistor-to-capacitor connection terminal;

the N inverters each have a first bias terminal and a second bias terminal;

the first control terminal of the driving circuit is coupled to an input terminal of a first inverter of the N inverters;

a first bias terminal of the first inverter is coupled to the power line;

a second bias terminal of an $N_{th}$ inverter of the N inverters is coupled to the system ground;

first bias terminals of the second to the $N_{th}$ inverter of the N inverters are coupled to output terminals of the first to an $(N-1)_{th}$ inverters of the N inverters, respectively; and the first connection terminal to the $(N-1)_{th}$ connection terminal connecting the bias units in series from the power line to the system ground are further coupled to second bias terminals of the first to the $(N-1)_{th}$ inverters, respectively.

9. The electrostatic discharge clamp as claimed in claim 5, wherein each bias unit is a resistor.

10. The electrostatic discharge clamp as claimed in claim 5, wherein each bias unit comprises a resistor and an off-state metal oxide semiconductor field-effect transistor connected in series.

11. The electrostatic discharge clamp as claimed in claim 5, wherein the bias units form a diode string.

12. The electrostatic discharge clamp as claimed in claim 2, wherein:

each capacitor in the capacitor and resistor network is a metal-oxide-semiconductor capacitor.

13. The electrostatic discharge clamp as claimed in claim 2, wherein:

the capacitors in the capacitor and resistor network are all metal-oxide-metal capacitors or are all metal-insulator-metal capacitors.

14. The electrostatic discharge clamp as claimed in claim 2, wherein:

the capacitors in the capacitor and resistor network are in a hybrid configuration formed by metal-oxide-semiconductor and metal-oxide-metal capacitors, or formed by metal-oxide-semiconductor and metal-insulator-metal capacitors.

\* \* \* \* \*